US012569887B2

(12) United States Patent
Kinoshita et al.

(10) Patent No.: US 12,569,887 B2
(45) Date of Patent: Mar. 10, 2026

(54) SUBSTRATE PROCESSING APPARATUS AND SUBSTRATE PROCESSING METHOD

(71) Applicant: Tokyo Electron Limited, Tokyo (JP)

(72) Inventors: Takafumi Kinoshita, Kumamoto (JP); Yuki Ito, Kumamoto (JP); Daisuke Saiki, Kumamoto (JP); Tomoyuki Hashimoto, Kumamoto (JP); Yoshifumi Amano, Kumamoto (JP); Kazuhiro Aiura, Kumamoto (JP); Akira Fujita, Kumamoto (JP); Shuhei Takahashi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 73 days.

(21) Appl. No.: 18/410,113

(22) Filed: Jan. 11, 2024

(65) Prior Publication Data

US 2024/0238848 A1     Jul. 18, 2024

(30) Foreign Application Priority Data

Jan. 12, 2023     (JP) ................................. 2023-003074
Oct. 23, 2023     (JP) ................................. 2023-181905

(51) Int. Cl.
*B08B 3/02*          (2006.01)
*H01L 21/67*         (2006.01)
(52) U.S. Cl.
CPC ........ *B08B 3/022* (2013.01); *H01L 21/67051* (2013.01); *B08B 2203/02* (2013.01)

(58) Field of Classification Search
CPC ........................... B08B 3/022; B08B 2203/02; H01L 21/67051
USPC ......................................................... 134/157
See application file for complete search history.

(56) References Cited

U.S. PATENT DOCUMENTS

2014/0116478 A1*  5/2014  Higashijima ..... H01L 21/67051
                                                      134/104.2
2022/0111422 A1*  4/2022  Ito ........................... B08B 3/022

FOREIGN PATENT DOCUMENTS

JP          2010-021279 A      1/2010

* cited by examiner

*Primary Examiner* — Tinsae B Ayalew
(74) *Attorney, Agent, or Firm* — Venjuris, P.C.

(57)                    ABSTRACT
A substrate processing apparatus includes a support unit, a supply unit, an annular member, a rotation unit, a cover member, and an annular flow regulation member disposed above the cover member. The annular member includes an inclined surface inclined downward toward a center of the annular member in a radial direction. The flow regulation member includes a base portion and a protrusion which faces a circumferential portion of the substrate supported on the support unit and protrudes from the base portion toward the circumferential portion of the substrate. The protrusion overlaps the support unit when viewed in a vertical direction. A lower surface of the protrusion is positioned above an upper surface of the substrate supported on the support unit and positioned below an upper surface of the annular member. An inner circumferential surface of the protrusion is inclined radially outward from an upper side to a lower side.

17 Claims, 9 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2023-003074 and 2023-181905, filed on Jan. 12, 2023 and Oct. 23, 2023, respectively, with the Japan Patent Office, the disclosures of which are incorporated herein in their entireties by reference.

TECHNICAL FIELD

The present disclosure relates to a substrate processing apparatus and a substrate processing method.

BACKGROUND

Japanese Patent Laid-Open Publication No. 2010-021279 discloses a liquid processing apparatus for processing a rear surface of a substrate with a processing liquid (e.g., a chemical liquid or a rinse liquid). The apparatus includes a support unit for supporting a substrate, a rotation unit for rotating the substrate supported on the support unit, a supply unit for supplying a cleaning liquid to a rear surface of the substrate supported on the support unit, and a cup disposed to surround a periphery of the substrate supported on the support unit. When the cleaning liquid is supplied from the supply unit to the rear surface of the rotating substrate, the cleaning liquid flows from a central portion of the rear surface of the substrate toward a peripheral portion thereof by a centrifugal force. Thus, the rear surface of the substrate is processed. The cleaning liquid shaken off from the substrate is scattered toward the cup, collected in the cup, and then discharged to the outside of the liquid processing apparatus.

SUMMARY

According to an aspect, a substrate processing apparatus includes a support unit configured to support a substrate by being in contact with a rear surface of the substrate, a supply unit configured to supply a processing liquid toward the rear surface of the substrate supported on the support unit, an annular member disposed to surround a periphery of the substrate supported on the support unit from the outside, a rotation unit configured to rotate the support unit and the annular member, a cover member having an annular shape and disposed to surround the annular member from the outside, and a flow regulation member having an annular shape and disposed above the cover member. The annular member may include an inclined surface inclined downward toward a center of the annular member in a radial direction of the annular member. The flow regulation member may include a base portion and a protrusion which directly faces a circumferential portion of the substrate supported on the support unit and protrudes from the base portion toward the circumferential portion of the substrate. The protrusion may overlap the support unit when viewed in a vertical direction. A lower surface of the protrusion may be positioned above an upper surface of the substrate supported on the support unit and positioned below an upper surface of the annular member. An inner circumferential surface of the protrusion may be inclined radially outward from an upper side to a lower side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
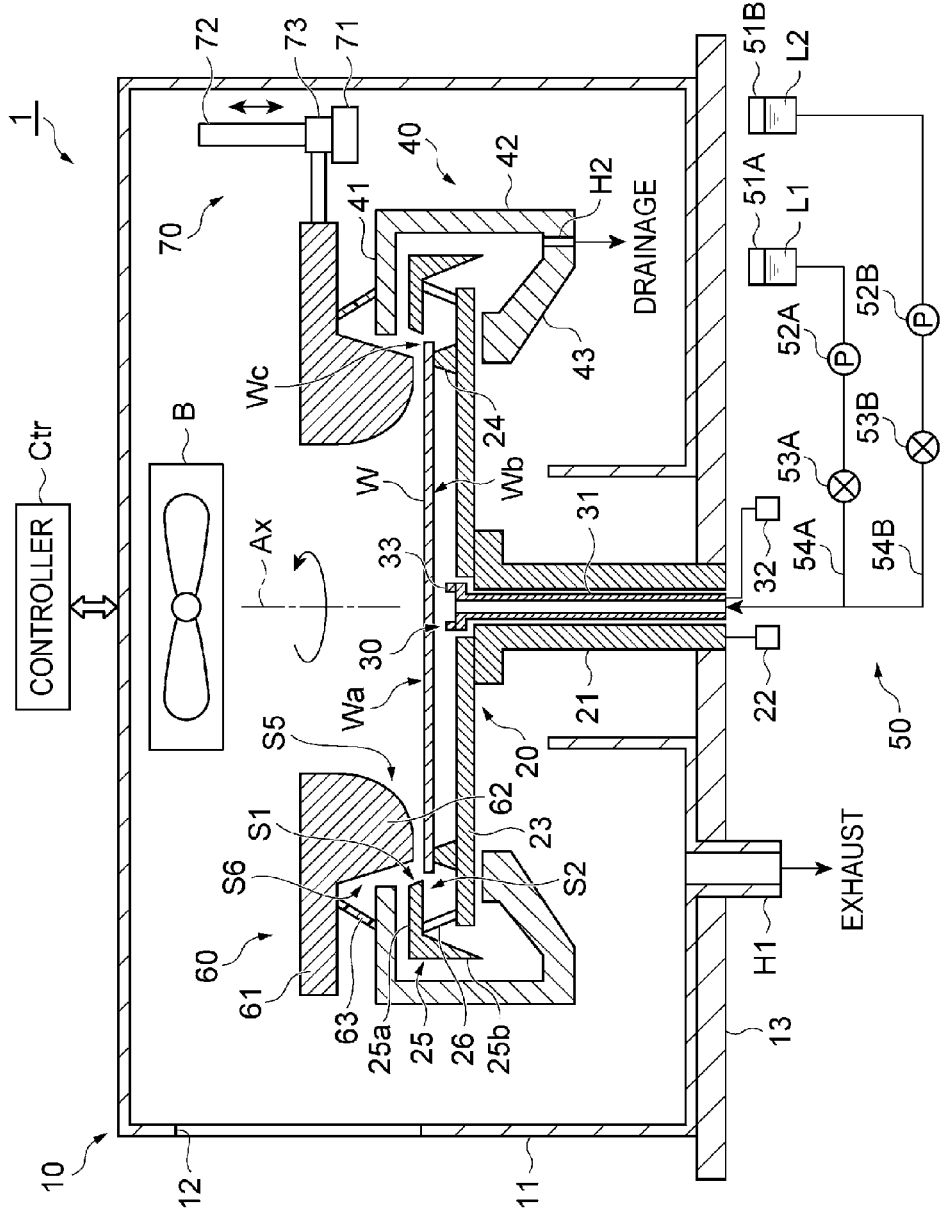
FIG. 1 is a schematic cross-sectional view illustrating an example of a substrate cleaning apparatus.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the following description, the same symbols are used for the same elements or for elements having the same function, and redundant descriptions are omitted. Meanwhile, in this specification, expressions such as upper, lower, right, and left in the accompanying drawings are based on the direction of a symbol in the drawings.

[Configuration of Substrate Cleaning Apparatus]

First, a configuration of an example of a substrate cleaning apparatus 1 (substrate processing apparatus) will be described with reference to FIGS. 1 to 4. The substrate cleaning apparatus 1 is configured to clean a rear surface Wb of a substrate W with a cleaning liquid (processing liquid). The substrate W may be, for example, a semiconductor substrate (e.g., silicon wafer). A diameter of the substrate W may be, for example, in a range of about 200 mm to 450 mm. The substrate W may have a disk shape or a plate shape, such as a polygonal shape, other than a circular shape. A portion of the substrate W may be cut to have a cutout portion. The cutout portion may be, for example, a notch (e.g., a U-shaped or V-shaped groove) or a straight portion extending in a straight line (so-called orientation flat).

As illustrated in FIG. 1, the substrate cleaning apparatus 1 includes a case 10, a rotation unit 20, an elevation unit 30, a cover member 40, a supply unit 50, a flow regulation member 60, an elevation unit 70, a blower B, and a controller Ctr (control unit).

The case 10 mainly accommodates the rotation unit 20, the elevation unit 30, the cover member 40, the flow regulation member 60, the elevation unit 70, and the blower B. A loading/unloading port 12 is formed in a side wall 11 of the case 10. Through the loading/unloading port 12, the substrate W is loaded into the case 10 and is also unloaded to the outside of the case 10 by a transport mechanism (e.g., a robot arm) (not illustrated). An exhaust pipe H1 extending downward is installed on a bottom wall 13 of the case 10. The exhaust pipe H1 is connected to a suction pump (not illustrated) and functions as an exhaust passage for discharging gases in the cover member 40 to the outside of the case 10.

The rotation unit 20 includes a rotation shaft 21, a driving mechanism 22, a support plate 23, a plurality of support pins 24 (support unit), and an annular member 25. The rotation shaft 21 is a hollow tubular member that vertically extends. The rotation shaft 21 is attached to the bottom wall 13 of the case 10 to be rotated around a central axis Ax.

The driving mechanism 22 is connected to the rotation shaft 21. The driving mechanism 22 operates based on an operation signal transmitted from the controller Ctr and is configured to rotate the rotation shaft 21. The driving mechanism 22 may be, for example, a power source such as an electric motor.

The support plate 23 is, for example, a flat plate having an annular shape and horizontally extends. That is, a through-hole is formed in a central portion of the support plate 23. An inner circumferential portion of the support plate 23 is connected to a front end of the rotation shaft 21. Therefore, the support plate 23 is provided to rotate around the central axis Ax of the rotation shaft 21 according to the rotation of the rotation shaft 21.

The plurality of support pins 24 are installed on the support plate 23 to protrude upward from an upper surface of the support plate 23. The plurality of support pins 24 are configured to support the substrate W substantially horizontally due to front ends thereof in contact with the rear surface Wb of the substrate W. For example, the plurality of support pins 24 may each have a cylindrical shape or a frustum shape. The plurality of support pins 24 may be disposed to be spaced an approximately equal interval from each other near an outer circumferential portion of the support plate 23 to form an overall circular shape when viewed from above. For example, when the plurality of support pins 24 are provided as 12 support pins, the plurality of support pins 24 may be disposed at about 30° intervals.

The annular member 25 has an annular shape and is disposed to surround the outer circumferential portion of the support plate 23. That is, the annular member 25 is configured to surround a periphery of the substrate W supported on the plurality of support pins 24 from the outside. The annular member 25 is connected to the outer circumferential portion of the support plate 23 by a plurality of connection members 26. Therefore, the annular member 25 is configured to rotate around the central axis Ax of the rotation shaft 21 according to the rotation of the rotation shaft 21.

Figure 2:
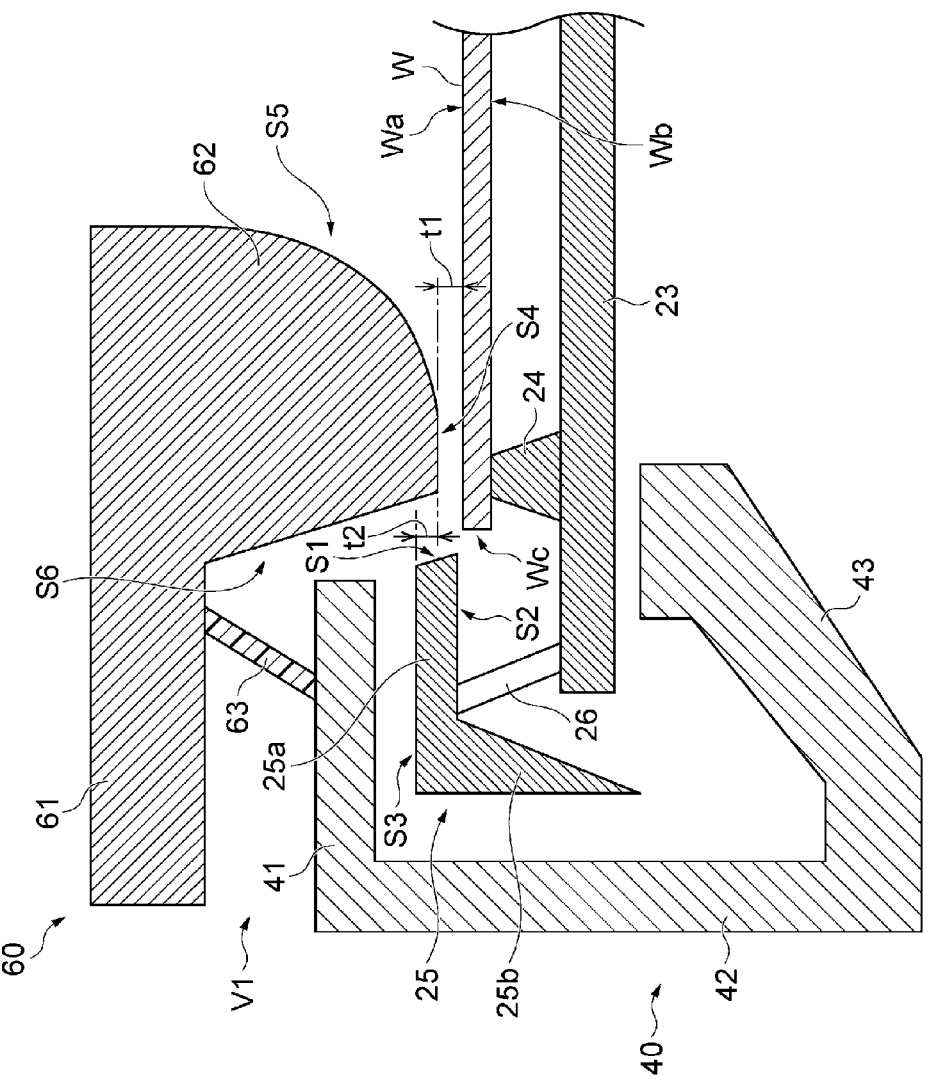
FIG. 2 is a schematic cross-sectional view partially illustrating the vicinity of a flow regulation member in the substrate cleaning apparatus of FIG. 1.

As illustrated in FIGS. 1 and 2, the annular member 25 may include an upper wall portion 25a and a side wall portion 25b. The upper wall portion 25a is, for example, a plate-shaped body having an annular shape and horizontally extends. An inner circumferential surface of the upper wall portion 25a is an inclined surface S1 inclined with respect to a horizontal direction. The inclined surface S1 is inclined downward toward a center of the annular member 25 in a radial direction of the annular member 25. In other words, the inclined surface S1 is inclined downward and inward in the radial direction. A height position of a lower surface S2 of the upper wall portion 25a may be at a level that is higher than, equal to, or lower than that of a height position of an upper surface Wa of the substrate W supported on the plurality of support pins 24.

An inner circumferential portion of the upper wall portion 25a may have a tapered shape that narrows radially inward due to the presence of the inclined surface S1 and the lower surface S2. The inclined surface S1 and the lower surface S2 may each be a flat surface or a non-flat surface (e.g., a curved surface). In order to increase the fluidity of cleaning liquids L1 and L2 (described below), a surface of the annular member 25 including the inclined surface S1 and the lower surface S2 may include a plurality of irregularities due to dimple processing and/or embossing processing or may include grooves or protrusions extending in the radial direction. Alternatively, for the purpose of increasing the fluidity of the cleaning liquids L1 and L2, surface treatment may be performed or a film may be formed on the surface of the annular member 25 including the inclined surface S1 and the lower surface S2.

The side wall portion 25b may have, for example, a cylindrical shape. An upper end of the side wall portion 25b may be integrally connected to an outer circumferential portion of the upper wall portion 25a. The side wall portion 25b may have a tapered shape that narrows downward.

As illustrated in FIG. 1, the elevation unit 30 includes a shaft member 31, a driving mechanism 32, and a plurality of support pins 33. The shaft member 31 is a hollow tubular member that vertically extends. The shaft member 31 is provided to be rotated around the central axis Ax and vertically movable. The shaft member 31 is inserted into and passes through the rotation shaft 21.

The driving mechanism 32 is connected to the shaft member 31. The driving mechanism 32 operates based on an operation signal transmitted from the controller Ctr and is configured to raise and lower the shaft member 31. As the driving mechanism 32 raises and lowers the shaft member 31, the shaft member 31 may vertically move between a raised position (not illustrated) at which the plurality of support pins 33 are positioned above the plurality of support pins 24 and a lowered position (see, e.g., FIG. 1) at which the plurality of support pins 33 are positioned below the plurality of support pins 24. The driving mechanism 22 may be, for example, a power source such as a linear actuator.

The plurality of support pins 33 are installed on the shaft member 31 to protrude upward from an upper end of the shaft member 31. The plurality of support pins 33 are configured to support the substrate W due to front ends thereof in contact with the rear surface Wb of the substrate W. For example, the plurality of support pins 33 may have a cylindrical shape or a frustum shape. The plurality of support pins 33 may be disposed to be spaced an approximately equal interval from each other to form an overall circular shape when viewed from above.

The cover member 40 has an overall annular shape and is installed to surround the annular member 25 and the support plate 23 from the outside. The cover member 40 functions as a liquid collection container that receives the cleaning liquids L1 and L2 that are supplied to the rear surface Wb of the substrate W and shaken off from the substrate W.

As illustrated in FIGS. 1 and 2, the cover member 40 may include an upper wall portion 41, a side wall portion 42, and a bottom wall portion 43. The upper wall portion 41 is, for example, a plate-shaped body having an annular shape and horizontally extends. The upper wall portion 41 may or may not overlap the inclined surface S1 when viewed from above. For example, an inner circumferential surface of the upper wall portion 41 may be positioned radially outside the inclined surface S1. In other words, the inclined surface S1 may be positioned closer to the center of the annular member 25 than the inner circumferential surface of the upper wall portion 41. The upper wall portion 41 does not overlap the substrate W supported on the plurality of support pins 24 when viewed from above.

The side wall portion 42 may have, for example, a cylindrical shape. An upper end of the side wall portion 42 may be integrally connected to an outer circumferential portion of the upper wall portion 41. A lower end of the side wall portion 42 may be integrally connected to an outer circumferential portion of the bottom wall portion 43. The bottom wall portion 43 may be inclined upward in a radially inward direction. A through-hole H2 is formed in a bottom of the bottom wall portion 43. The through-hole H2 functions as a drain passage for discharging the cleaning liquids L1 and L2 collected in the cover member 40 to the outside of the case 10.

As illustrated in FIG. 1, the supply unit 50 is configured to supply the cleaning liquids L1 and L2 to the rear surface Wb of the substrate W through the inside of the shaft member 31. That is, the shaft member 31 functions as a nozzle for supplying the cleaning liquids L1 and L2 to the rear surface Wb of the substrate W. The supply unit 50 includes liquid sources 51A and 51B, pumps 52A and 52B, valves 53A and 53B, and pipes 54A and 54B.

The liquid source 51A functions as a supply source for the cleaning liquid L1. The cleaning liquid L1 may be, for example, a cleaning chemical liquid for removing unnecessary films, such as SiN, attached to the rear surface Wb of the substrate W. The cleaning chemical liquid may include, for example, a diluted hydrogen fluoride (DHF) liquid, an SC-1 liquid (a mixed solution of ammonia, hydrogen peroxide, and deionized water (DIW)), or hydrogen peroxide. The pump 52A operates based on an operation signal transmitted from controller Ctr and is configured to suction the cleaning liquid L1 from the liquid source 51A and deliver the cleaning liquid L1 to the shaft member 31 through the valve 53A and the pipe 54A. The valve 53A operates based on an operation signal transmitted from the controller Ctr and is configured to open and close the pipe 54A before and after the valve 53A operates. The pipe 54A sequentially connects the liquid source 51A, the pump 52A, and the valve 53A from an upstream side.

The liquid source 51B functions as a supply source for the cleaning liquid L2. The cleaning liquid L2 may be, for example, a rinse liquid for cleaning foreign materials (e.g., particles and chemical residue). The rinse liquid may include, for example, DIW. The pump 52B operates based on an operation signal transmitted from the controller Ctr and is configured to suction the cleaning liquid L2 from the liquid source 51B and deliver the cleaning liquid L2 to the shaft member 31 through the valve 53B and the pipes 54A and 54B. The valve 53B operates based on an operation signal transmitted from the controller Ctr and is configured to open and close the pipe 54B before and after the valve 53B operates. The pipe 54B sequentially connects the liquid source 51B, the pump 52B, and the valve 53B from an upstream side. A downstream end of the pipe 54B is connected to the pipe 54A between the valve 53A and the shaft member 31.

The flow regulation member 60 is disposed above the cover member 40. The flow regulation member 60 includes a base portion 61, a protrusion 62, and a sealing member 63. The base portion 61 is, for example, a plate-shaped body having an annular shape and horizontally extends. An outer circumferential portion of the base portion 61 overlaps the upper wall portion 41 when viewed from above. The outer circumferential portion of the base portion 61 is a portion of the base portion 61 that is positioned radially outside the protrusion 62. Meanwhile, when viewed from above, an inner circumferential portion of the base portion 61 does not overlap the upper wall portion 41 and overlaps a circumferential portion Wc of the substrate W supported on the plurality of support pins 24.

The protrusion 62 is installed to protrude downward from a lower surface of the inner circumferential portion of the base portion 61. Therefore, when viewed from above, the protrusion 62 overlaps (directly faces) the circumferential portion Wc of the substrate W supported on the plurality of support pins 24 and also overlaps the plurality of support pins 24.

As illustrated in FIG. 2, a lower surface S4 of the protrusion 62 may be positioned above an upper surface Wa of the substrate W supported on the plurality of support pins 24 and may be positioned below an upper surface S3 of the upper wall portion 25a of the annular member 25. In other words, a height position of the lower surface S4 of the protrusion 62 may overlap the inclined surface S1 when viewed in a horizontal direction.

A straight line distance t1 between the lower surface S4 of the protrusion 62 and the upper surface Wa of the substrate W supported on the plurality of support pins 24 may be, for example, in a range of about 1 mm to 2 mm. A straight line distance t2 between the lower surface S4 of the protrusion 62 and the upper surface S3 of the upper wall portion 25a of the annular member 25 may be, for example, in a range of about 0.5 mm to 2.5 mm or about 1.6 mm to 1.8 mm.

An inner circumferential surface S5 of the protrusion 62 is inclined radially outward from an upper side to a lower side. As illustrated in FIG. 2, the inner circumferential surface S5 of the protrusion 62 may be a trumpet-shaped curved surface. The curved surface may protrude toward a central portion of the flow regulation member 60. Although not illustrated, the inner circumferential surface S5 of the protrusion 62 may be a truncated cone-shaped surface. That is, when a cross section of the protrusion 62 is viewed in a horizontal direction, the inner circumferential surface S5 of the protrusion 62 may extend in a flat shape.

An outer circumferential surface S6 of the protrusion 62 may be inclined radially inward from an upper side to a lower side. As illustrated in FIG. 2, when the cross section of the protrusion 62 is viewed in the horizontal direction, the outer circumferential surface S6 of the protrusion 62 may extend in a flat shape. When the flow regulation member 60 is positioned at a processing position (described below) (see, e.g., FIG. 2), the outer circumferential surface S6 near a lower end of the protrusion 62 may horizontally face the inclined surface S1 of the upper wall portion 25a of the annular member 25. For example, when the flow regulation member 60 is positioned at the processing position, the outer circumferential surface S6 near the lower end of the protrusion 62 may extend approximately parallel to the inclined surface S1 of the upper wall portion 25a of the annular member 25.

The sealing member 63 has a cylindrical body having an annular shape. As illustrated in FIG. 2, the sealing member 63 may have a cylindrical frustum shape whose diameter extends radially outward from an upper side to a lower side. As illustrated in FIG. 2, the sealing member 63 may be installed on a lower surface of the outer circumferential portion of the base portion 61 to protrude downward from the lower surface. Although not illustrated, the sealing member 63 may be installed on an upper surface of the upper wall portion 41 to protrude upward from the upper surface.

When the flow regulation member 60 is positioned at the processing position (see, e.g., FIG. 2), the sealing member 63 is supported by being sandwiched between the lower surface of the outer circumferential portion of the base portion 61 and the upper surface of the upper wall portion 41. Therefore, the sealing member 63 seals a space V1 (see, e.g., FIG. 2) between the lower surface of the outer circumferential portion of the base portion 61 and the upper surface of the upper wall portion 41. The sealing member 63 may be made of a flexible material (e.g., fluorine rubber, silicone rubber, or ethylene propylene rubber). In this case, when the sealing member 63 seals the space V1, the sealing member 63 is deformed and the base portion 61 and/or the upper wall portion 41 are raised, thereby improving sealing properties.

As illustrated in FIG. 1, the elevation unit 70 is configured to vertically move the flow regulation member 60 based on an instruction from the controller Ctr. Specifically, the elevation unit 70 is configured to vertically move the flow regulation member 60 between a raised position for loading or unloading the substrates W with respect to the plurality of support pins 24 and a processing position at which the flow regulation member 60 is disposed near the upper wall portion 41 of the cover member 40 to process the substrate W.

The elevation unit 70 may be, for example, a linear actuating cylinder. The elevation unit 70 may include a base member 71 (stopping member), a rod 72, and a slider 73 (stopping member). The rod 72 extends linearly upward from the base member 71. The slider 73 is connected to the flow regulation member 60 and configured to vertically move in an extending direction (vertical direction) of the rod 72 based on an instruction from the controller Ctr. When the slider 73 is lowered to a lower end of the rod 72, the slider 73 comes into contact with the base member 71 and stops. Therefore, the base member 71 and the slider 73 have a function of preventing the flow regulation member 60 from moving below the processing position.

The blower B is disposed above the rotation unit 20, the elevation unit 30, the cover member 40, and the flow regulation member 60 in the case 10. The blower B operates based on a signal transmitted from the controller Ctr and is configured to form a downward flow that passes through an inner space of the flow regulation member 60 and heads toward the upper surface Wa of the substrate W.

Figure 3:
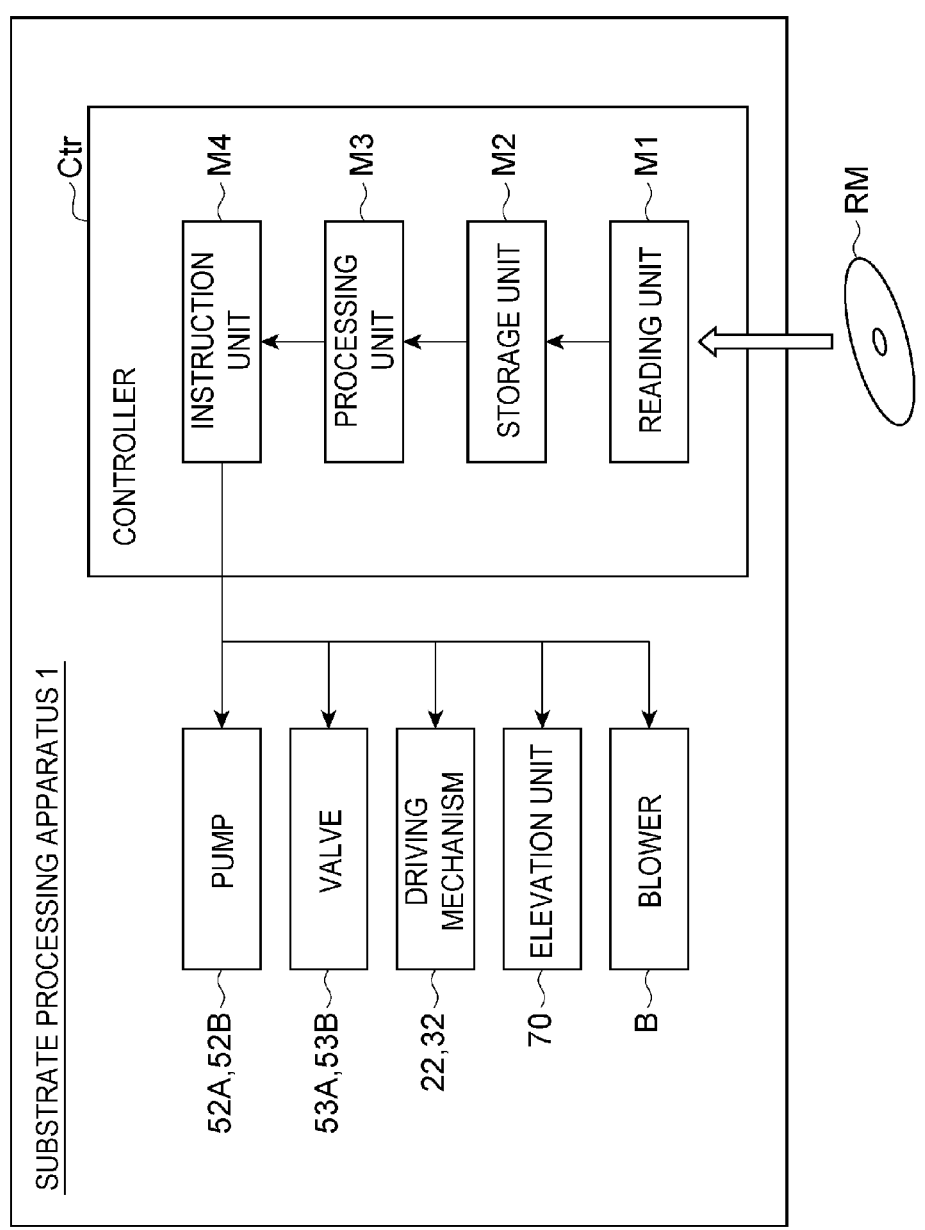
FIG. 3 is a block diagram illustrating an example of main parts of the substrate cleaning apparatus of FIG. 1.
Figure 4:
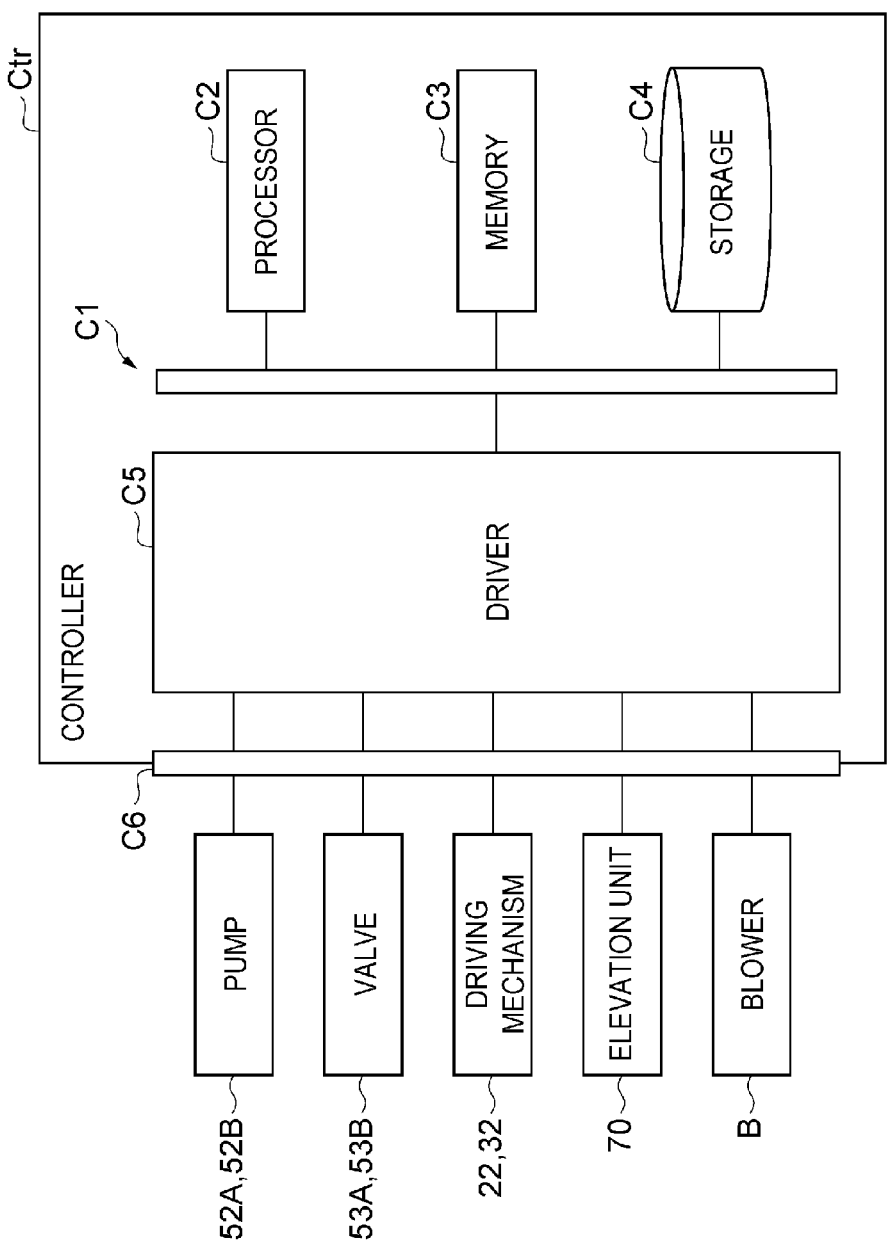
FIG. 4 is a schematic diagram illustrating an example of a hardware configuration of a controller.

As illustrated in FIG. 3, the controller Ctr includes a reading unit M1, a storage unit M2, a processing unit M3, and an instruction unit M4 as function modules. These function modules merely divide the functions of the controller Ct into a plurality of modules for convenience, and this does not mean that the hardware constituting the controller Ctr is divided into such modules. Each function module is not limited to being implemented by executing a program and may be implemented using a dedicated electrical circuit (e.g., a logic circuit) or an integrated circuit (e.g., application specific integrated circuit (ASIC)) formed by integrating the same.

The reading unit M1 is configured to read a program from a computer-readable recording medium RM. The recording medium RM records programs for operating each part of the substrate cleaning apparatus 1. The recording medium RM may be, for example, a semiconductor memory, an optical recording disk, a magnetic recording disk, or a magneto-optical recording disk.

The storage unit M2 is configured to store various types of data. The storage unit M2 may store, for example, a program read from the recording medium RM by the reading unit M1 or setting data input by an operator through an external input device (not illustrated).

The processing unit M3 is configured to process various types of data. The processing unit M3 may be configured to, based on various types of data stored in the storage unit M2, generate an operation signal for operating each part of the substrate cleaning apparatus 1 (e.g., the driving mechanisms 22 and 32, the pumps 52A and 52B, and the valves 53A and 53B, the elevation unit 70, or the blower B).

The instruction unit M4 is configured to transmit the operation signal generated in the processing unit M3 to each part of the substrate cleaning apparatus 1.

The instruction unit M4 may execute a first process in which the shaft member 31 is raised to a raised position by the driving mechanism 32 and the substrate W is supported on the plurality of support pins 33. After the first process, the instruction unit M4 may execute a second process in which the shaft member 31 is lowered to a lowered position by the driving mechanism 32 while the substrate W is supported on the plurality of support pins 33. In this case, the substrate W is placed on the plurality of support pins 24. After the second process, the instruction unit M4 may execute a third process in which the substrate W is rotated by the rotation unit 20, and in this state, the supply unit 50 is controlled to supply the cleaning liquids L1 and L2 from the shaft member 31 to the rear surface Wb of the substrate W supported on the plurality of support pins 24.

The hardware of the controller Ctr may include, for example, one or more control computers. The controller Ctr may include, for example, a circuit C1 illustrated in FIG. 4, which is formed on hardware. The circuit C1 may include electrical circuit elements (circuitry). The circuit C1 may include, for example, a processor C2, a memory C3 (memory device), a storage C4 (storage unit), a driver C5, and an input/output port C6. The processor C2 cooperates with at least one of the memory C3 and the storage C4 to execute programs and execute input/output signals through the input/output port C6, thereby constituting each of the above-described function modules. The memory C3 and the storage C4 function as the storage unit M2. The driver C5 is a circuit that drives each part of the substrate cleaning apparatus 1. The input/output port C6 inputs or outputs signals between the driver C5 and each part of the substrate cleaning apparatus 1.

The substrate cleaning apparatus 1 may include one controller Ctr or may include a controller group (control unit) including a plurality of controllers Ctr. In the latter case, each of the above function modules may be implemented using one controller Ctr or may be implemented using a combination of two or more controllers Ctr. When the controller Ctr includes the plurality of computers (circuit C1), each of the above-described function modules may be implemented using one computer (circuit C1) or may be implemented using a combination of two or more computers (circuit C1). The controller Ctr may include a plurality of processors C2. In this case, the above-described function modules may each be implemented using one processor C2 or may be implemented using a combination of two or more processors C2.

[Cleaning Process]

Figure 5:
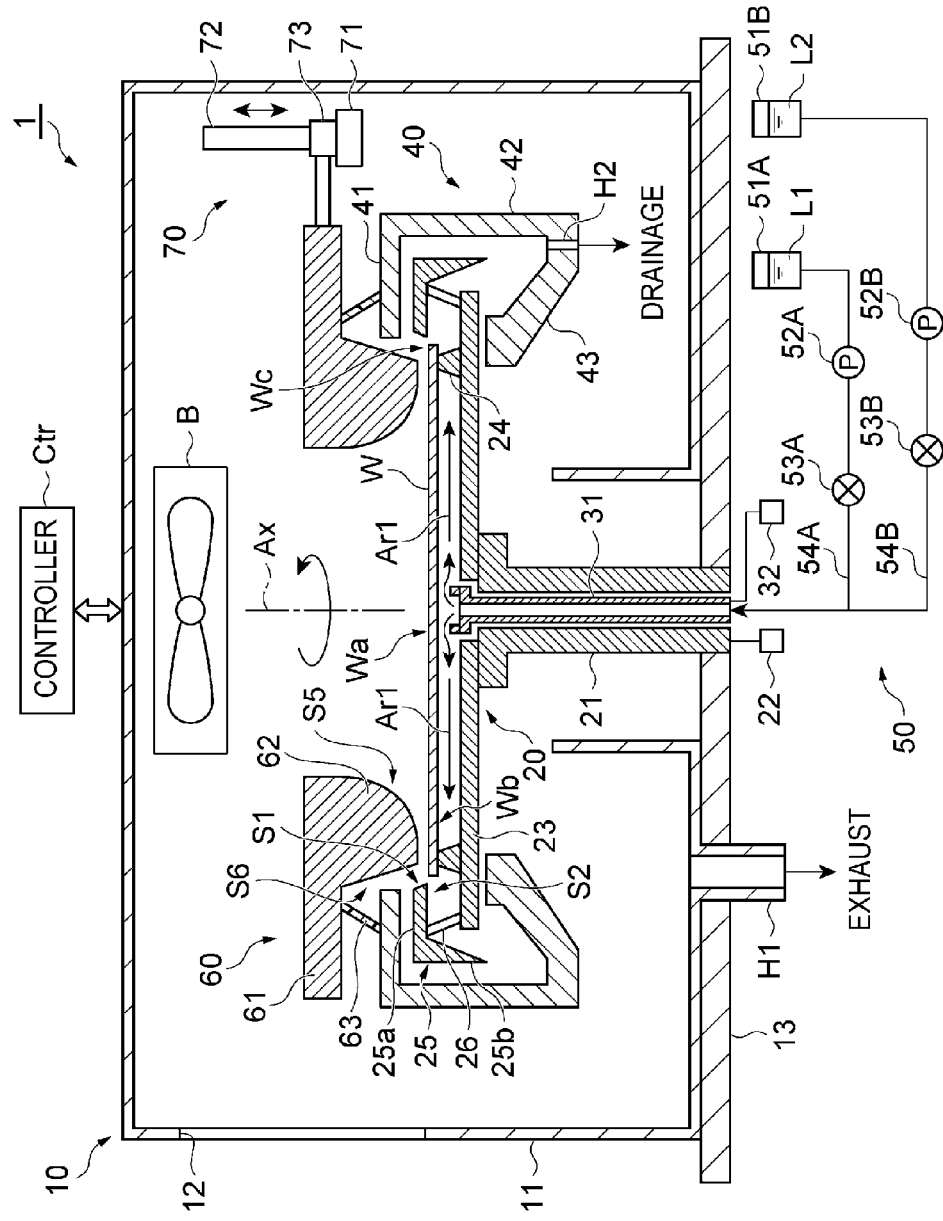
FIG. 5 is a view illustrating an example of a substrate cleaning process.

Next, a cleaning process for the substrate W in the substrate cleaning apparatus 1 will be described with reference to FIGS. 5 to 7.

First, the substrate W is loaded into the case 10 by a transport mechanism (not illustrated). In this case, the controller Ctr controls the driving mechanism 32 to position the shaft member 31 at a raised position. In addition, the controller Ctr controls the elevation unit 70 to position the flow regulation member 60 at the raised position. The substrate W loaded into the case 10 through the loading/unloading port 12 is delivered to the support pins 33 by the transport mechanism. Thus, the substrate W is placed on the support pins 33 (elevation unit 30) such that the rear surface Wb is in contact with the support pins 33.

Next, the controller Ctr controls the driving mechanism 32 to lower the shaft member 31 to a lowered position. In a process of lowering the shaft member 31, the substrate W is transferred from the support pins 33 to the support pins 24. Thus, the substrate W is placed on the support pins 24 (rotation unit 20) such that the rear surface Wb is in contact with the support pins 24.

Then, the controller Ctr controls the elevation unit 70 to lower the flow regulation member 60 to the processing position. Thus, the sealing member 63 is sandwiched and supported between the lower surface of the outer circumferential portion of the base portion 61 and the upper surface of the upper wall portion 41, and thus the space V1 is sealed.

Subsequently, the controller Ctr controls the driving mechanism 22 to rotate the rotation shaft 21 at a certain rotational speed. In this case, the support plate 23 and the annular member 25 rotate through the rotation shaft 21, and the substrate W placed on the support pins 24 also rotates. In addition, the controller Ctr controls the blower B to form a downward flow that passes through the inner space of the flow regulation member 60 and heads toward the upper surface Wa of the substrate W.

Next, the controller Ctr controls the supply unit 50 to supply the cleaning liquids L1 and L2 to the rear surface Wb of the rotating substrate W through the shaft member 31. As a result, as illustrated in FIGS. 5 to 7, the cleaning liquids L1 and L2 flow along the rear surface Wb toward an outer circumference of the substrate W by centrifugal force and then are externally shaken off from the outer circumference of the substrate W (see, e.g., arrow Ar1 in FIGS. 5 to 7). As a result, the entire rear surface Wb is cleaned by the cleaning liquids L1 and L2.

Figure 6:
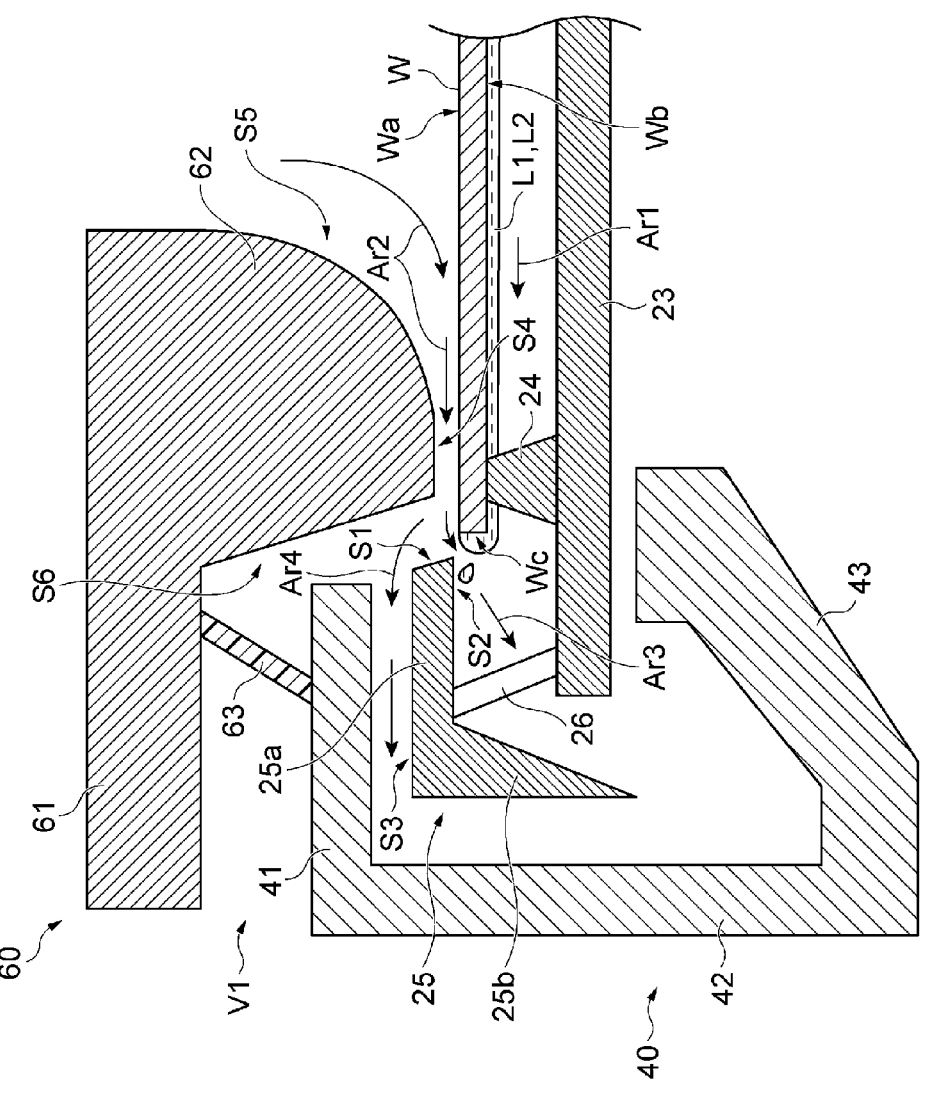
FIG. 6 is a schematic cross-sectional view partially illustrating the vicinity of a flow regulation member in a substrate cleaning apparatus illustrated in FIG. 5.
Figure 7:
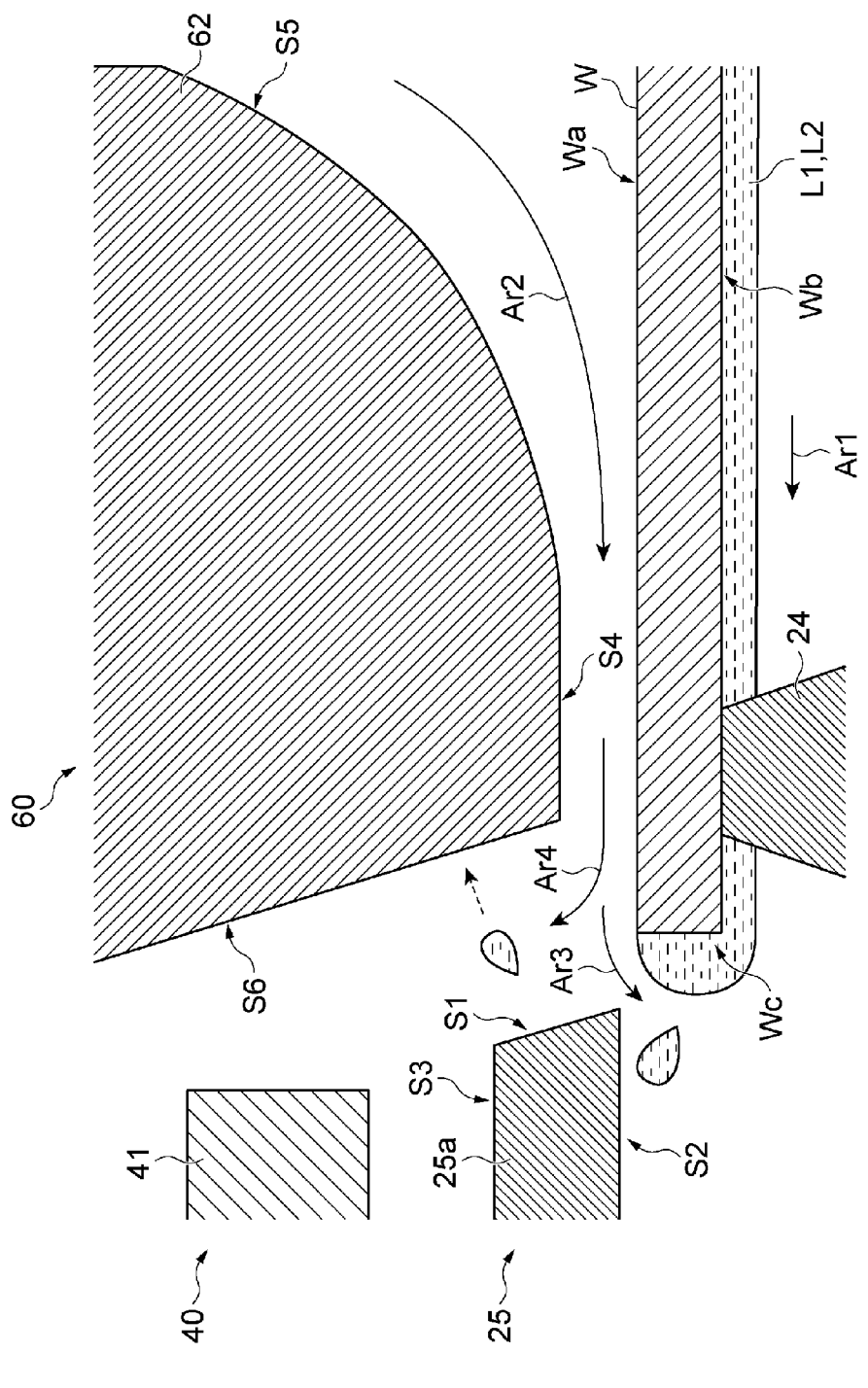
FIG. 7 is a schematic cross-sectional view partially illustrating the vicinity of the flow regulation member in the substrate cleaning apparatus illustrated in FIG. 6.

Meanwhile, as illustrated in FIGS. 6 and 7, the downward flow formed by the blower B flows along the inner circumferential surface S5 of the protrusion 62 and flows between the lower surface S4 of the protrusion 62 and the upper surface Wa of the substrate W (see, e.g., arrow Ar2 in FIGS. 6 and 7). Thereafter, the air flow branches into a first branched flow (see, e.g., arrow Ar3 in FIGS. 6 and 7) and a second branched flow (see, e.g., arrow Ar4 in FIGS. 6 and 7). The first branched flow flows between the inclined surface S1 of the upper wall portion 25a of the annular member 25 and the circumferential portion Wc of the substrate W. The second branched flow flows between the inclined surface S1 of the upper wall portion 25a of the annular member 25 and the outer circumferential surface S6 of the protrusion 62. Therefore, as illustrated in FIGS. 6 and 7, the cleaning liquids L1 and L2 shaken off from the substrate W are mainly blocked by the first branched flow and are suppressed from circulating to the upper surface Wa of the substrate W. Furthermore, even when water droplets of the cleaning liquid L1 and L2 shaken off from the substrate W collide with the upper wall portion 25a to splash or become mist, due to the presence of the protrusion 62, the cleaning liquid L1 and L2 are prevented from reaching a center of the substrate W and flow between the inclined surface S1 and the outer circumferential surface S6 along with the second branched flow.

Next, after a certain time has elapsed, the controller Ctr controls the supply unit 50 to stop the supply of the cleaning liquids L1 and L2. Next, the controller Ctr controls the driving mechanism 22 to stop the rotation of the rotation shaft 21.

Next, the controller Ctr controls the elevation unit 70 to raise the flow regulation member 60 to the raised position. Next, the controller Ctr controls the driving mechanism 32 to raise the shaft member 31 to the raised position. In a process of raising the shaft member 31, while the substrate W is transferred from the support pins 24 to the support pins 33, the substrate W is also raised. Thus, the substrate W is placed on the support pins 33 such that the rear surface Wb is in contact with the support pins 33.

Thereafter, the transport mechanism (not illustrated) receives the substrate W from the support pins 33 and unloads the substrate W from the case 10. In this way, the cleaning process for the rear surface Wb of the substrate W is completed.

[Actions]

According to the above example, the inner circumferential surface S5 of the protrusion 62 of the flow regulation member 60 is inclined radially outward from an upper side to a lower side. Therefore, an air flow descending toward the upper surface Wa of the substrate W from above smoothly flows to the upper surface Wa of the circumferential portion Wc of the substrate W along the inner circumferential surface S5. In addition, since the protrusion 62 faces the circumferential portion Wc of the substrate W supported on the plurality of support pins 24, a gap between the protrusion 62 and the circumferential portion Wc of the substrate W narrows. Therefore, the air flow smoothly guided to the upper surface Wa of the circumferential portion Wc of the substrate W by the inner circumferential surface S5 of the protrusion 62 flows between the lower surface S4 of the protrusion 62 and the substrate W flows at high speed in a narrow passage formed between the lower surface S4 of the protrusion 62 and the upper surface Wa of the circumferential portion Wc (see, e.g., arrow Ar2 in FIGS. 6 and 7).

Here, a simulation using a computer was performed to confirm that the air flow flows at high speed in the narrow passage. In Calculation Example 1, under conditions in which, in the substrate cleaning apparatus 1 described above, the blower B was not operated and the atmosphere inside the case 10 was exhausted by a suction pump through the exhaust pipe H1 at an exhaust pressure equivalent to 200 Pa, a state of the air flow near the flow regulation member 60 and the circumferential portion Wc of the substrate W was calculated. In Calculation Example 2, under the same conditions as in Calculation Example 1, except that the flow regulation member 60 was not installed and the atmosphere inside the case 10 was exhausted at an exhaust pressure equivalent to 240 Pa, a state of the air flow near the circumferential portion Wc of the substrate W was calculated.

Figure 8A:
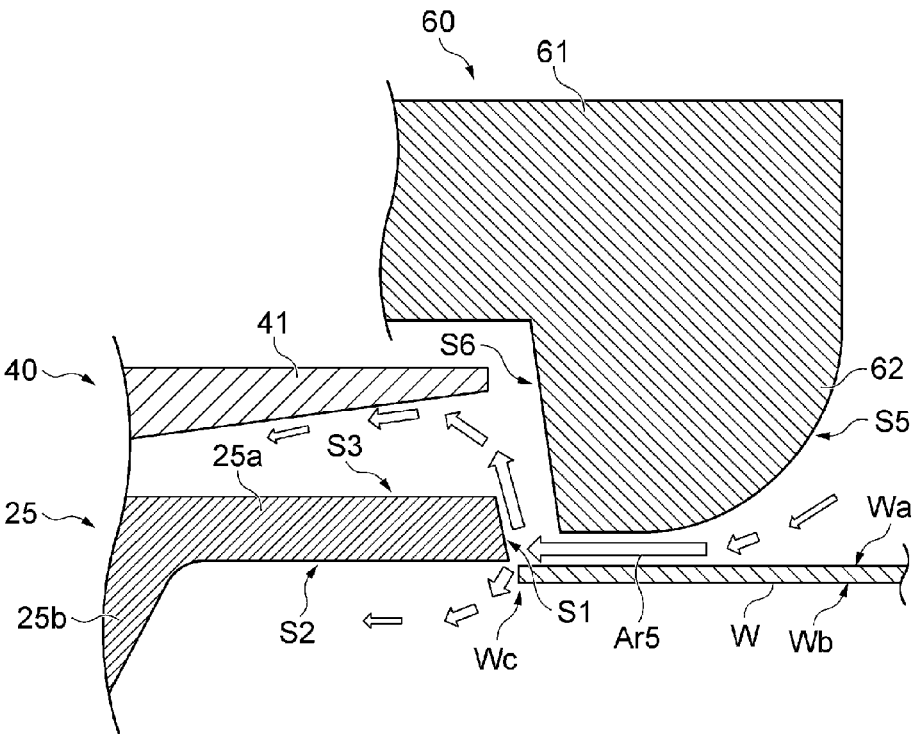
FIG. 8A is a diagram illustrating an example of a simulation result showing a state of an air flow near the flow regulation member in the substrate cleaning apparatus of FIG. 1.
Figure 8B:
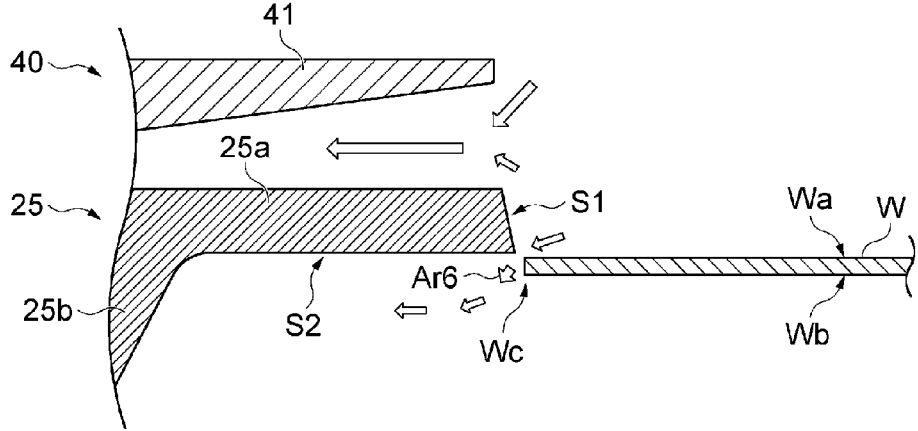
FIG. 8B is a diagram illustrating an example of a simulation result showing a state of an air flow near a circumferential portion of a substrate when there is no flow regulation member in the substrate cleaning apparatus of FIG. 1.

Results of Calculation Example 1 are illustrated in FIG. 8A, and results of Calculation Example 2 are illustrated in FIG. 8B. In FIGS. 8A and 8B, a direction of the air flow is schematically illustrated as being a direction of an arrow, and the strength of the air flow is schematically illustrated by a size of the arrow. In Calculation Example 1, the maximum speed of the air flow (see, e.g., arrow Ar5 in FIG. 8A) flowing through the narrow channel was 23.6 m/sec. Meanwhile, in Calculation Example 2, the maximum speed of the air flow (see, e.g., arrow Ar6 in FIG. 8B) flowing between the inclined surface S1 of the upper wall portion 25a of the annular member 25 and the circumferential portion Wc of the substrate W was 5.2 m/sec. Therefore, in Calculation Example 1, the speed of the air flow in the narrow channel was approximately 4.5 times greater than in Calculation Example 2.

In this way, in the above example, since the air flow flows at high speed in the narrow channel, the cleaning liquids L1 and 2 supplied to the rear surface Wb of the substrate W by the supply unit 50 are blocked by the high-speed air flow when reaching the circumferential portion of the substrate W and are prevented from circulating to the upper surface Wa of the circumferential portion Wc of the substrate W. As a result, since it is difficult for droplets to scatter due to the cleaning liquids L1 and L2 circulating to the upper surface Wa of the circumferential portion Wc of the substrate W, it is possible to suppress foreign materials from being attached to the upper surface Wa of the circumferential portion Wc of the substrate W. In addition, the high-speed air flow flowing between the protrusion 62 and the upper surface Wa of the circumferential portion Wc of the substrate W does not depend on the rotational speed of the substrate W during substrate processing. Therefore, it is possible to suppress foreign materials from being attached to the upper surface Wa of the circumferential portion Wc of the substrate W in a wide range of rotational speeds of the substrate W from low speed to high speed during substrate processing.

According to the above example, the flow regulation member 60 includes the protrusion 62 that protrudes from the base portion 61 toward the circumferential portion Wc of the substrate W. Therefore, even when droplets or mist of the cleaning liquids L1 and L2 is scattered near the circumferential portion of the substrate W, most scattered particles are attached to the outer circumferential surface S6 of the protrusion 62. Therefore, due to the presence of the protrusion 62, the scattered particles are prevented from moving toward the center of the substrate W. As a result, it is possible to further suppress foreign materials from being attached to the upper surface Wa of the circumferential portion Wc of the substrate W.

According to the above example, the protrusion 62 of the flow regulation member 60 overlaps the plurality of support pins 24 when viewed in a vertical direction. Therefore, the substrate W is pressed against the plurality of support pins 24 by the high-speed air flow flowing through the narrow passage. Therefore, when the substrate W is processed by the cleaning liquids L1 and L2, the warpage of the substrate W is suppressed. As a result, it is possible to process the substrate W more uniformly.

According to the above example, since the annular member 25 includes the inclined surface S1, the high-speed air flow flowing between the protrusion 62 and the upper surface Wa of the circumferential portion Wc of the substrate W flows along the inclined surface S1 and is smoothly guided to a downstream side (see, e.g., arrow Ar4 in FIGS. 6 and 7). Therefore, it is difficult for the high-speed air flow to be disturbed between the annular member 25 and the flow regulation member 60. Therefore, even when droplets or mist of the cleaning liquids L1 and L2 is scattered near a circumference of the substrate W, the scattered particles flow to the downstream side along with the high-speed air flow and are unlikely to attach to the upper surface Wa of the substrate W. As a result, it is possible to further suppress foreign materials from being attached to the upper surface Wa of the circumferential portion Wc of the substrate W.

According to the above example, when the flow regulation member 60 is positioned at the processing position, a gap between the flow regulation member 60 and the cover member 40 is sealed by the sealing member 63. Therefore, external gas is prevented from flowing into an inner space between the flow regulation member 60, the cover member 40 and the annular member 25 through the gap, and also gas is prevented from being discharged from the inner space to the outside through the gap. Accordingly, since the internal space may be easily kept clean, it is possible to further suppress foreign materials from being attached to the upper surface Wa of the circumferential portion Wc of the substrate W processed in the internal space.

According to the above example, when the flow regulation member 60 is lowered to the processing position from the raised position, the sealing member 63 is deformed to expand outward in a radial direction and come into contact with the upper wall portion 41 of the cover member 40. Thus, even when the horizontal and vertical positioning of the flow regulation member 60 with respect to the cover member 40 is not exact, the gap between the flow regulation member 60 and the cover member 40 may be sealed by the sealing member 63. Therefore, it is possible to implement sealing of the gap between the flow regulation member 60 and the cover member 40 with a simple apparatus configuration.

According to the above example, the base member 71 and the slider 73 prevent the flow regulation member 60 from moving to a lower side than the processing position. Therefore, it is possible to position the flow regulation member 60 at a certain processing position while avoiding the flow regulation member 60 from being in contact with the cover member 40.

According to the above example, the inner circumferential surface S5 of the protrusion 62 may be a truncated cone-shaped surface or a trumpet-shaped curved surface. In this case, the air flow descending toward the upper surface Wa of the substrate W from above more smoothly flows along the inner circumferential surface S5 to the upper surface Wa of the circumferential portion Wc of the substrate W.

According to the above example, the outer circumferential surface S6 of the protrusion 62 may be inclined radially inward from an upper side to a lower side. In this case, since the outer circumferential surface S6 of the protrusion 62 extends along the inclined surface S1 of the annular member 25, a width of a downstream passage formed between the outer circumferential surface S6 of the protrusion 62 and the inclined surface S1 of the annular member 25 is difficult to change. Therefore, it becomes possible to secure a narrow passage having a certain length for generating a high-speed air flow while suppressing pressure loss from becoming excessive due to the downstream passage becoming extremely narrow.

According to the above example, the outer circumferential surface S6 of the protrusion 62 may face the inclined surface S1 of the annular member 25 to extend substantially parallel to the inclined surface S1 when the flow regulation member 60 is positioned at the processing position. In this case, a width of the downstream passage becomes approximately constant. Therefore, it is possible to more effectively secure a certain width of the downstream passage and a certain length of the narrow passage.

According to the above example, the height position of the lower surface S2 of the annular member 25 may be at a level that is higher than or equal to the height position of the upper surface Wa of the substrate W supported on the plurality of support pins 24. In this case, the high-speed air flow generated in the narrow passage easily flows by branching into an air flow (second branched flow) flowing through the downstream passage formed between the outer circumferential surface S6 of the protrusion 62 and the inclined surface S1 of the annular member 25 and an air flow (first branched flow) flowing through a separate downstream passage formed between the circumference of the substrate W and the upper wall portion 25a of the annular member 25. Therefore, it is more difficult for droplets to scatter due to the cleaning liquids L1 and L2 circulating to the upper surface Wa of the circumferential portion Wc of the substrate W, and thus it is possible to further suppress foreign materials from being attached to the upper surface Wa of the circumferential portion Wc of the substrate W.

Modified Example

The embodiment disclosed herein should be construed illustrative in all respects and not restrictive. Various omissions, substitutions, and changes may be made to the above examples may be made without departing from the scope of the claims and the gist thereof.

Figure 9:
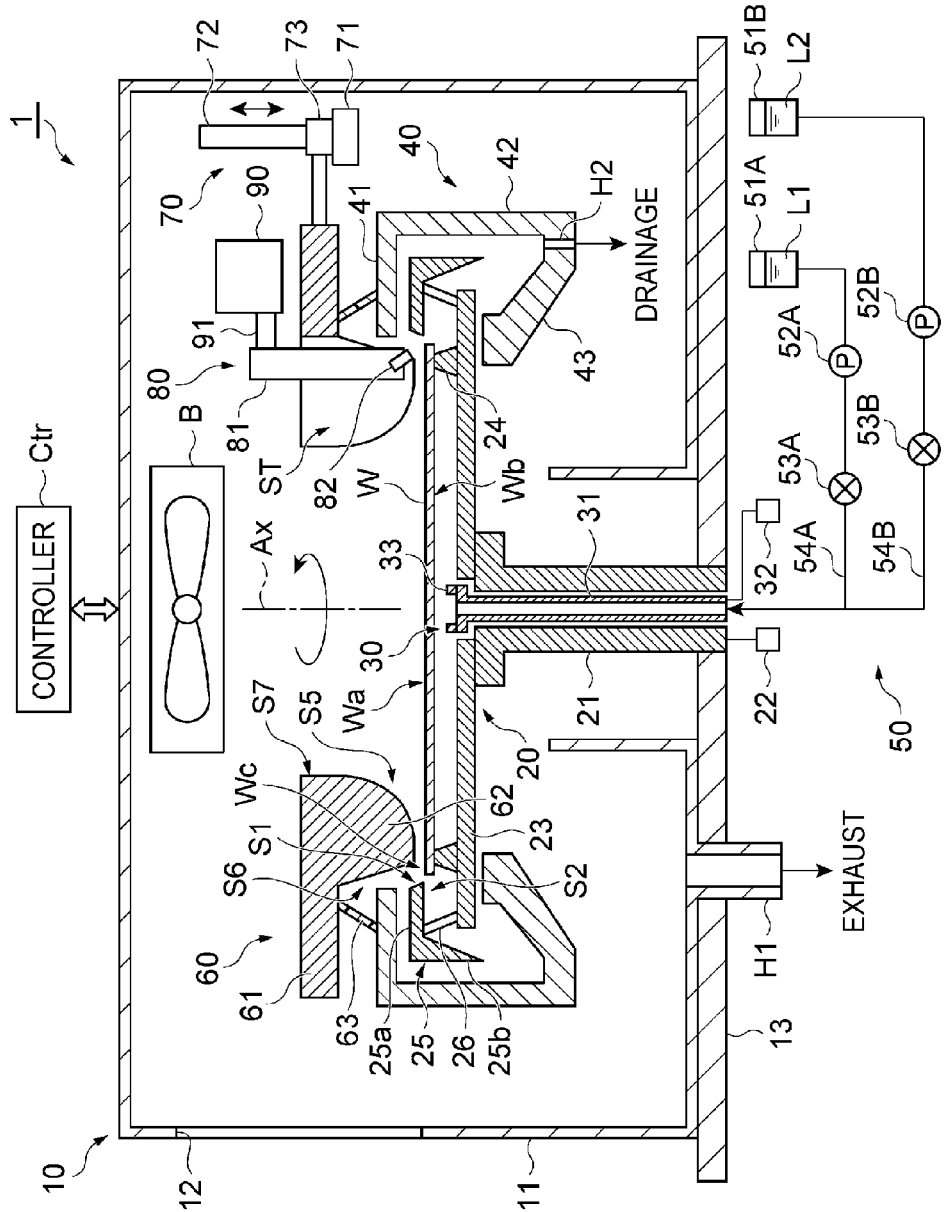
FIG. 9 is a schematic cross-sectional view illustrating another example of a substrate cleaning apparatus.

(1) As illustrated in FIG. 9, a substrate cleaning apparatus 1 may further include a supply unit 80 (another supply unit) and a driving mechanism 90 (driving unit). The supply unit 80 is configured to supply a cleaning liquid to an outer circumferential area of an upper surface Wa of a substrate W supported on a plurality of support pins 24 rather than an innermost circumferential surface S7 of a flow regulation member 60 when viewed in a vertical direction. In other words, in the example of FIG. 9, the supply unit 80 may be configured to supply the cleaning liquid toward an area of the upper surface Wa of the substrate W supported on the plurality of support pins 24 that overlaps the flow regulation member 60 when viewed in the vertical direction. The supply unit 80 may be configured to supply the cleaning liquid toward a circumferential portion Wc of the upper surface Wa of the substrate W supported on the plurality of support pins 24. The cleaning liquid may be, for example, a rinse liquid such as DI.

The supply unit 80 may be disposed in a slit ST formed in a portion of the flow regulation member 60. That is, the flow regulation member 60 may have a C-shape (curved shape) of which a width corresponding to a size of the supply unit 80 is cut. The supply unit 80 includes a main body 81 and a nozzle 82.

The main body 81 is configured to supply a cleaning liquid from a liquid source (not illustrated) to the nozzle 82. The nozzle 82 is configured to spray the cleaning liquid onto the upper surface Wa of the substrate W. A discharge port of the nozzle 82 may face a direction along a tangent to an outer circumference of the substrate W when viewed from above. When viewed from above, the tangent may pass through an intersection where an imaginary line connecting a center of the substrate W and the discharge port of the nozzle 82 intersects the outer circumference of the substrate W. The discharge port of the nozzle 82 may face an outer side of the substrate W in a radial direction rather than the tangent. The discharge port of the nozzle 82 may face the same direction as the rotation direction of the substrate W.

Before a supply unit 50 starts to spray a cleaning liquid L1 onto a rear surface Wb of the substrate W, the supply unit 80 may start to spray the cleaning liquid onto the upper surface Wa of the substrate W. The spraying of the cleaning liquid L1 onto the upper surface Wa of the substrate W by the supply unit 80 may be stopped after the spraying of the cleaning liquid L1 onto the rear surface Wb of the substrate W by the supply unit 50 is completed or after the supply unit 50 starts to spray the cleaning liquid L2 onto the rear surface Wb of the substrate W.

The driving mechanism 90 is configured to move the supply unit 80 above the substrate W supported on the plurality of support pins 24. As illustrated in FIG. 9, the driving mechanism 90 may be connected to the main body 81 through a connection member 91. The driving mechanism 90 may be configured to move the supply unit 80 in a radial direction of the substrate W when viewed from above. The driving mechanism 90 may be configured to vertically move the supply unit 80.

According to the example of FIG. 9, due to the cleaning liquid supplied by the supply unit 80, the cleaning liquid L1 supplied to the rear surface Wb of the substrate Wis is suppressed from going around the outer circumference of the substrate W to reach the upper surface Wa of the substrate W. Therefore, it is possible to suppress foreign materials from being generated at a circumferential portion of the upper surface Wa of the substrate W. Furthermore, since an air flow is flowing at high speed in a narrow passage, even when mist is generated when the cleaning liquid supplied from the supply unit 80 collides with the substrate W, the mist is suppressed from being scattered toward the center of the upper surface Wa of the substrate W. Furthermore, the cleaning liquid supplied by the supply unit 80 removes the mist attached to the circumferential portion of the upper surface Wa of the substrate W. As a result, it is possible to further suppress foreign materials from being attached to the upper surface Wa of the substrate W.

In the example of FIG. 9, for example, the driving mechanism 90 may move the supply unit 80 from the outside of the outer circumference of the substrate W toward the central portion of the substrate W (so-called scan-in operation). In this case, since the supply unit 80 performs the scan-in operation, when the cleaning liquid supplied from the supply unit 80 lands on the upper surface Wa of the substrate W, it is possible to suppress the liquid from being scattered to the surroundings.

In the example of FIG. 9, the driving mechanism 90 may vertically move the supply unit 80. In this case, even when the substrate W is deformed such as being warped, a separation distance between a discharge port for the cleaning liquid from the supply unit 80 (the discharge port of the nozzle 82) and a point at which the cleaning liquid lands on the upper surface Wa of the substrate W may be set to be constant irrespective of the warpage of the substrate W. Accordingly, scattering of mist when the cleaning liquid supplied from the supply unit 80 collides with the substrate W is suppressed. As a result, even when the substrate W is deformed such as being warped, it is possible to further suppress foreign materials from being attached to the upper surface Wa of the substrate W.

Other Examples

Example 1. As an example, a substrate processing apparatus includes a support unit for supporting a substrate by being in contact with a rear surface of the substrate, a supply unit for supplying a processing liquid toward the rear surface of the substrate supported on the support unit, an annular member disposed to surround the periphery of the substrate supported on the support unit from the outside, a rotation unit for rotating the support unit and the annular member, an annular cover member disposed to surround the annular member from the outside, and an annular flow regulation member disposed above the cover member. The annular member includes an inclined surface inclined downward toward a center of the annular member in a radial direction of the annular member. The flow regulation member includes a base portion and a protrusion that faces a circumferential portion of the substrate supported on the support unit and protrudes from the base portion toward the circumferential portion of the substrate. The protrusion overlaps the support unit when viewed in a vertical direction. A lower surface of the protrusion is positioned above an upper surface of the substrate supported on the support unit and positioned below an upper surface of the annular member. An inner circumferential surface of the protrusion is inclined radially outward from an upper side to a lower side.

In this case, the inner circumferential surface of the protrusion of the flow regulation member is inclined radially outward from the upper side to the lower side. Therefore, an air flow descending toward the upper surface of the substrate from above smoothly flows to an upper surface of the circumferential portion of the substrate along the inner circumferential surface. In addition, since the protrusion faces the circumferential portion of the substrate supported on the support unit, a gap between the protrusion and the upper surface of the circumferential portion of the substrate is decreased. Therefore, the air flow smoothly guided to the upper surface of the circumferential portion of the substrate by the inner circumferential surface of the protrusion flows at high speed in a narrow passage formed between the lower surface of the protrusion and the upper surface of the circumferential portion of the substrate. Accordingly, when the processing liquid supplied to the rear surface of the substrate by the supply unit reaches a circumference of the substrate, the processing liquid is blocked by the high-speed air flow and is prevented from circulating to the upper surface of the circumferential portion of the substrate. As a result, it becomes difficult for droplets to scatter due to the processing liquid circulating to the upper surface of the circumferential portion of the substrate, and thus it is possible to suppress foreign materials from being attached to the upper surface of the circumferential portion of the substrate. In addition, the high-speed air flow flowing between the protrusion and the upper surface of the circumferential portion of the substrate does not depend on a rotational speed of the substrate during substrate processing. Therefore, it is possible to suppress foreign materials from being attached to the upper surface of the circumferential portion of the substrate in a wide range of rotational speeds of the substrate from low speed to high speed during substrate processing.

Furthermore, according to Example 1, the flow regulation member includes the protrusion that protrudes from the base portion toward the circumferential portion of the substrate. Therefore, even when droplets or mist of the processing liquid is scattered near the circumferential portion of the substrate, most scattered particles are attached to an outer circumferential surface of the protrusion. Therefore, due to the presence of the protrusion, the scattered particles are prevented from moving toward the center of the substrate. As a result, it is possible to further suppress foreign materials from being attached to the upper surface of the circumferential portion of the substrate.

Furthermore, according to Example 1, the protrusion of the flow regulation member overlaps the support unit when viewed in a vertical direction. Therefore, the substrate is pressed against the support unit by the high-speed air flow flowing through the narrow passage. Therefore, when the substrate is processed with the processing liquid, warpage of the substrate is suppressed. As a result, it is possible to process the substrate more uniformly.

Furthermore, according to Example 1, since the annular member includes the inclined surface, the high-speed air flow flowing between the protrusion and the upper surface of the circumferential portion of the substrate is smoothly guided downstream along the inclined surface. Therefore, it is difficult for the high-speed air flow to be disturbed between the annular member and the flow regulation member. Therefore, even when droplets or mist of the processing liquid is scattered near the circumference of the substrate, scattered particles flow downstream along with the high-speed air flow and are unlikely to attach to the upper surface of the substrate. As a result, it is possible to further suppress foreign materials from being attached to an upper surface of the circumferential portion of the substrate.

Example 2. In the apparatus of Example 1, the flow regulation member is provided to be vertically movable between a raised position for loading or unloading a substrate with respect to the support unit and a processing position positioned near an upper wall portion of the cover member to process the substrate. The flow regulation member may further include an annular sealing member for sealing a space between a portion of the base portion positioned radially outside the protrusion and an upper wall portion of the cover member when the flow regulation member is positioned at the processing position. In this case, when the flow regulation member is positioned at the processing position, a gap between the flow regulation member and the cover member is sealed by the sealing member. Therefore, external gas is prevented from flowing into an inner space between the flow regulation member, the cover member and the annular member through the gap, and also gas is prevented from being discharged from the inner space to the outside through the gap. Accordingly, since the internal space may be easily kept clean, it is possible to further suppress foreign materials being attached to the upper surface of the circumferential portion of the substrate W processed in the internal space.

Example 3. In the apparatus of Example 2, the sealing member may be made of a flexible material, may be installed on a lower surface of a portion of the base portion positioned radially outside the protrusion and may have a cylindrical frustum shape whose diameter extends radially outward from an upper side to a lower side. In this case, when the flow regulation member is lowered from the raised position to the processing position, the sealing member is deformed to spread outward in the radial direction and comes into contact with the upper wall portion of the cover member. Therefore, even when the horizontal and vertical positioning of the flow regulation member with respect to the cover member is not exact, the gap between the flow regulation member and the cover member may be sealed by the sealing member. Therefore, it is possible to implement sealing of the gap between the flow regulation member and the cover member with a simple apparatus configuration.

Example 4. The apparatus of Example 2 or Example 3 may further include a stopping member for preventing the flow regulation member from moving to a lower side than the processing position. In this case, it is possible to position the flow regulation member at a certain processing position while avoiding the flow regulation member from being in contact with the cover member.

Example 5. In the apparatus described in any one of Examples 1 to 4, the inner circumferential surface of the protrusion may be a truncated cone-shaped surface or a trumpet-shaped curved surface. In this case, an air flow descending toward the upper surface of the substrate from above more smoothly flows to the upper surface of the circumferential portion of the substrate along the inner circumferential surface.

Example 6. In any one apparatus of Examples 1 to 5, the outer circumferential surface of the protrusion may be inclined radially inward from an upper side to a lower side. In this case, since the outer circumferential surface of the protrusion extends along the inclined surface of the annular member, a width of a downstream passage formed between the outer circumferential surface of the protrusion and the inclined surface of the annular member is difficult to change. Therefore, it is possible to secure a narrow passage having a certain length for generating a high-speed air flow while suppressing pressure loss from becoming excessive due to the downstream passage becoming extremely narrow.

Example 7. In the apparatus of Example 6, the outer circumferential surface of the protrusion may extend substantially parallel to the inclined surface of the annular member. In this case, a width of the downstream passage becomes approximately constant. Therefore, it is possible to more effectively secure a certain width of the downstream passage and a certain length of the narrow passage.

Example 8. In any one apparatus of Examples 1 to 7, a height position of a lower surface of the annular member may be at a level that is higher than or equal to a height position of the upper surface of the substrate supported on the support unit. In this case, the high-speed air flow generated in the narrow passage easily flows by branching toward a downstream passage formed between the outer circumferential surface of the protrusion and the inclined surface of the annular member and a separate downstream passage formed between the circumference of the substrate and the annular member. Therefore, it becomes more difficult for droplets to scatter due to the processing liquid circulating to the upper surface of the circumferential portion of the substrate, and thus it is possible to further suppress foreign materials from being attached to the upper surface of the circumferential portion of the substrate.

Example 9. Any one apparatus of Examples 1 to 8 may further include a separate supply unit for supplying a cleaning liquid toward an outer circumferential area of the upper surface of the substrate supported on the support unit rather than an innermost circumferential surface of the flow regulation member when viewed in a vertical direction. In this case, due to the cleaning liquid supplied by the separate supply unit, the cleaning liquid supplied to the rear surface of the substrate is suppressed from going around the outer circumference of the substrate to reach the upper surface of the substrate. Therefore, it is possible to suppress foreign materials from being generated at the circumferential portion of the upper surface of the substrate. Furthermore, since an air flow is flowing at high speed in a narrow passage, even when mist is generated when the cleaning liquid supplied from the separate supply unit collides with the substrate, the mist is suppressed from being scattered toward the center of the upper surface of the substrate. Furthermore, the cleaning liquid supplied by the separate supply unit removes the mist attached to the circumferential portion of the upper surface of the substrate. As a result, it is possible to further suppress foreign materials from being attached to the upper surface of the substrate.

Example 10. The apparatus of Example 9 may further include a driving unit for moving the separate supply unit above the substrate supported on the support unit. In Example 10, the driving unit may move the separate supply unit in a radial direction of the substrate. For example, the driving unit may move the separate supply unit from the outside of the outer circumference of the substrate to the central portion of the substrate (so-called scan-in operation). In this case, since the separate supply unit performs the scan-in operation, when the cleaning liquid supplied from the separate supply unit lands on the upper surface of the substrate, it is possible to suppress the liquid from being scattered to the surroundings. In Example 10, the driving unit may vertically move the separate supply unit. Therefore, even when the substrate is deformed such as being warped, a separation distance between a discharge port for the cleaning liquid from the supply unit and a point at which the cleaning liquid lands on the upper surface of the substrate may be set to be constant irrespective of the warpage of the substrate W. Accordingly, scattering of mist when the cleaning liquid supplied from a separate supply unit collides with the substrate is suppressed. As a result, even when the substrate is deformed such as being warped, it is possible to further suppress foreign materials from being attached to the upper surface of the substrate.

Example 11. As an example, a substrate processing method includes supplying a cleaning liquid to a rear surface of a substrate in a state where a support unit supporting the substrate by being in contact with the rear surface of the substrate and an annular member disposed to surround a periphery of the substrate rotate an annular flow regulation member is disposed above an annular cover member surrounding the annular member from the outside. The flow regulation member includes a base portion and a protrusion that faces a circumferential portion of the substrate supported on the support unit and protrudes from the base portion toward the circumferential portion of the substrate. The protrusion overlaps the support unit when viewed in a vertical direction. A lower surface of the protrusion is positioned above an upper surface of the substrate supported on the support unit and positioned below an upper surface of the annular member. An inner circumferential surface of the protrusion is inclined radially outward from an upper side to a lower side. In this case, the same operational effect as the apparatus in Example 1 is obtained.

According to a substrate processing apparatus and a substrate processing method according to the present disclosure, it is possible to suppress foreign materials from being attached to an upper surface of a circumferential portion of a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate support configured to support a substrate by being in contact with a rear surface of the substrate;
a liquid supply configured to supply a processing liquid toward the rear surface of the substrate supported on the substrate support;
an annular plate disposed to surround a periphery of the substrate supported on the support from the outside;
a rotator configured to rotate the substrate support and the annular plate;
a cover having an annular shape and disposed to surround the annular plate from the outside; and
a flow regulator having an annular shape and disposed above the cover,
wherein the annular plate includes an inclined surface inclined downward toward a center of the annular plate in a radial direction of the annular plate,
the flow regulator includes a base and a protrusion which directly faces a circumferential portion of the substrate supported on the substrate support and protrudes from the base toward the circumferential portion of the substrate,
the protrusion overlaps the substrate support when viewed in a vertical direction,
a lower surface of the protrusion is positioned above an upper surface of the substrate supported on the substrate support and positioned below an upper surface of the annular plate, and
an inner circumferential surface of the protrusion is inclined radially outward from an upper side to a lower side.

2. The substrate processing apparatus according to claim 1, wherein the flow regulator is provided to be vertically movable between a raised position for loading or unloading the substrate with respect to the substrate support and a processing position positioned near an upper wall portion of the cover to process the substrate, and further includes a seal having an annular shape and configured to seal a space between a portion of the base positioned radially outside the protrusion and the upper wall portion of the cover when the flow regulator is positioned at the processing position.

3. The substrate processing apparatus according to claim 2, wherein the seal is made of a rubber material, is installed on a lower surface of the portion of the base positioned radially outside the protrusion, and has a cylindrical frustum shape of which a diameter extends radially outward from an upper side to a lower side.

4. The substrate processing apparatus according to claim 2, further comprising a stopper configured to restrain the flow regulator from moving to a lower side than the processing position.

5. The substrate processing apparatus according to claim 1, wherein the inner circumferential surface of the protrusion is a truncated cone-shaped surface or a trumpet-shaped curved surface.

6. The substrate processing apparatus according to claim 1, wherein an outer circumferential surface of the protrusion is inclined radially inward from an upper side to a lower side.

7. The substrate processing apparatus according to claim 6, wherein the outer circumferential surface of the protrusion extends parallel to the inclined surface of the annular plate.

8. The substrate processing apparatus according to claim 1, wherein a height position of a lower surface of the annular plate is at a level that is higher than or equal to a height position of the upper surface of the substrate supported on the substrate support.

9. The substrate processing apparatus according to claim 1, further comprising a separate liquid supply configured to supply a cleaning liquid toward an outer circumferential area of the upper surface of the substrate supported on the substrate support rather than an innermost circumferential surface of the flow regulator when viewed in a vertical direction.

10. The substrate processing apparatus according to claim 9, further comprising a driver configured to move the separate liquid supply above the substrate supported on the substrate support.

11. The substrate processing apparatus according to claim 2, wherein a height position of a lower surface of the annular plate is at a level that is higher than or equal to a height position of the upper surface of the substrate supported on the substrate support.

12. The substrate processing apparatus according to claim 3, wherein a height position of a lower surface of the annular plate is at a level that is higher than or equal to a height position of the upper surface of the substrate supported on the substrate support.

13. The substrate processing apparatus according to claim 4, wherein a height position of a lower surface of the annular plate is at a level that is higher than or equal to a height position of the upper surface of the substrate supported on the substrate support.

14. The substrate processing apparatus according to claim 5, wherein a height position of a lower surface of the annular plate is at a level that is higher than or equal to a height position of the upper surface of the substrate supported on the substrate support.

15. The substrate processing apparatus according to claim 6, wherein a height position of a lower surface of the annular plate is at a level that is higher than or equal to a height position of the upper surface of the substrate supported on the substrate support.

16. The substrate processing apparatus according to claim 7, wherein a height position of a lower surface of the annular plate is at a level that is higher than or equal to a height position of the upper surface of the substrate supported on the substrate support.

17. A substrate processing method comprising:
supplying a processing liquid to a rear surface of a substrate in a state where a substrate support supporting the substrate by being in contact with the rear surface of the substrate and an annular plate disposed to surround a periphery of the substrate supported on the substrate support from the outside rotate by a rotator configured to rotate the substrate support and the annular plate, and an annular flow regulator is disposed above an annular cover surrounding the annular plate from the outside, from a liquid supply configured to supply the processing liquid toward the rear surface of the substrate supported on the substrate support,
wherein the annular plate includes an inclined surface inclined downward toward a center of the annular plate in a radial direction of the annular plate,
the flow regulator includes a base and a protrusion which directly faces a circumferential portion of the substrate supported on the substrate support and protrudes from the base toward the circumferential portion of the substrate,
the protrusion overlaps the substrate support when viewed in a vertical direction, a lower surface of the protrusion is positioned above an upper surface of the substrate supported on the substrate support and positioned below an upper surface of the annular plate, and an inner circumferential surface of the protrusion is inclined radially outward from an upper side to a lower side.

* * * * *